US006054718A

United States Patent [19]

Dodd et al.

[11] Patent Number: 6,054,718

[45] Date of Patent: Apr. 25, 2000

[54] QUANTUM WELL INFRARED PHOTOCATHODE HAVING NEGATIVE ELECTRON AFFINITY SURFACE

[75] Inventors: Mark A. Dodd, Arlington; Lewis T. Claiborne, Richardson, both of Tex.

[73] Assignee: Lockheed Martin Corporation, Bethesda, Md.

[21] Appl. No.: 09/052,096

[22] Filed: Mar. 31, 1998

[51] Int. Cl.[7] .......................... H01L 29/06; H01L 29/12; H01L 31/0232

[52] U.S. Cl. ................................ 257/10; 257/11; 257/21; 257/189; 257/432; 257/459

[58] Field of Search ................................ 257/14, 15, 21, 257/189, 432, 459, 457, 10, 11, 17; 250/338.4, 370.08, 370.14

[56] References Cited

U.S. PATENT DOCUMENTS

| | | | |
|---|---|---|---|
| 3,867,662 | 2/1975 | Endriz | 313/94 |
| 4,503,447 | 3/1985 | Iafrate et al. | 357/16 |
| 4,620,214 | 10/1986 | Margalit et al. | 357/63 |
| 4,772,931 | 9/1988 | Rogers | 357/30 |
| 4,807,006 | 2/1989 | Rogers et al. | 357/30 |
| 4,829,355 | 5/1989 | Munier et al. | 357/30 |
| 4,873,555 | 10/1989 | Coon et al. . | |
| 4,894,526 | 1/1990 | Bethea et al. . | |
| 4,903,101 | 2/1990 | Maserjian | 357/30 |
| 5,031,013 | 7/1991 | Choi | 357/30 |

(List continued on next page.)

FOREIGN PATENT DOCUMENTS

| | | |
|---|---|---|
| 0044610 | 1/1982 | European Pat. Off. . |
| 0345972 | 12/1989 | European Pat. Off. . |
| 2059247 | 10/1992 | European Pat. Off. . |
| 0532204 | 3/1993 | European Pat. Off. . |
| 0558308 | 9/1993 | European Pat. Off. . |
| 0829898 | 3/1998 | European Pat. Off. . |
| 2-241064 | 9/1990 | Japan . |
| 2051477 | 1/1981 | United Kingdom . |
| 2095900 | 10/1982 | United Kingdom . |
| 2113467 | 8/1983 | United Kingdom . |
| 2207801 | 2/1989 | United Kingdom . |
| 2228824 | 9/1990 | United Kingdom . |
| 9208250 | 5/1992 | WIPO . |
| 9315525 | 8/1993 | WIPO . |

OTHER PUBLICATIONS

Schwarz et al, "Anetnna–Coupled Infrared Detectors," pp. 1870–1873, May, 1997, Journal of Applied Physics vol. 48 No. 5.

Retledge et al, "Planar Multimode Detector Arrays for Infrared and Millimeter–Wave Applications," pp. 407–414, Mar. 1981, Journal of Quantum Electronics.

Yu et al, "A Metal Grating Coupled Bound–to–Miniband Transition GaAs Multiquantum Well Superlattice Infrared Detector," pp. 1332–1334, Sep. 9, 1991, Appl. Phys. Lett.

Levine, "Quantum–Well Infrared Photodetectors," pp. R1–R81, Oct. 15, 1993, Journal of Applied Physics, vol. 74 No. 8.

Sarusi et al, "Improved Performance of Quantum Well Infrared Photodetectors Using Random Scattering Optical Coupling," pp. 960–962, Feb. 21, 1994, Appl. Phys. Lett.

Schimert et al, "Enhanced Quantum Well Infrared Photodetector with Novel Multiple Quantum Well Grating Structure," pp. 2846–2848, May 13, 1996, Appl. Phys. Lett.

Faurie et al, "Molecular Beam Epitaxial Growth of High Quality HgTe and $Hg_{1-x}Cd_xTe$ Onto GaAs(001) Substrates," pp. 1307–1309, Dec. 15, 1984, Appl. Phys. Lett.

*Primary Examiner*—Minh Loan Tran
*Attorney, Agent, or Firm*—Sidley & Austin

[57] ABSTRACT

An infrared photocathode comprises an infrared radiation absorbing structure based on multiple quantum well (MQW) material on top of an electron conducting contact layer having a negative electron affinity back surface. In the first photocathode, a top contact layer is etched to form a transmissive diffraction grating to aid photon absorption in the MQW material. In the second photocathode, a plurality of spaced apart MQW structures form a diffraction grating which aids photon absorption in the MQW material.

41 Claims, 4 Drawing Sheets

U.S. PATENT DOCUMENTS 5,036,371 7/1991 Schwartz .................................... 357/16
5,063,419 11/1991 Glaser et al. .............................. 357/16
5,075,749 12/1991 Chi et al. .................................. 357/30
5,077,466 12/1991 Delacourt et al. .................... 250/211 J
5,077,593 12/1991 Sato et al. ................................. 357/30
5,120,664 6/1992 Murotani ...................................... 437/2
5,121,181 6/1992 Smith, III et al. ......................... 357/30
5,185,647 2/1993 Vasquez ...................................... 257/17
5,198,682 3/1993 Wu et al. .................................... 257/21
5,222,071 6/1993 Pezeshki .
5,223,703 6/1993 Setani ...................................... 250/208.1
5,229,614 7/1993 Andersson et al. ................ 250/370.12
5,239,186 8/1993 McIver et al. ............................. 257/21
5,272,356 12/1993 Wen et al. ................................. 257/21
5,281,542 1/1994 Hui et al. ..................................... 437/2
5,296,699 3/1994 Deveaud-Pledran et al. ....... 250/214.1
5,296,720 3/1994 Wen et al. ................................. 257/21
5,304,805 4/1994 Brown et al. ........................ 250/338.1
5,313,073 5/1994 Kuroda et al. ............................ 257/18
5,329,136 7/1994 Goossen ..................................... 257/17
5,352,904 10/1994 Wen et al. ................................ 257/21
5,355,000 10/1994 Delacourt et al. ........................ 257/14
5,384,469 1/1995 Choi ........................................... 257/21
5,404,026 4/1995 Mariella, Jr. et al. .................... 257/10
5,455,421 10/1995 Spears .................................. 250/338.4
5,479,018 12/1995 McKee et al. ....................... 250/338.1
5,510,627 4/1996 Snow .......................................... 257/21
5,519,529 5/1996 Ahearn et al. .......................... 359/248
5,536,948 4/1996 Lee ............................................. 257/17
5,539,206 7/1996 Schimert .............................. 250/338.4
5,567,955 10/1996 Liu ............................................ 257/21

QUANTUM WELL INFRARED PHOTOCATHODE HAVING NEGATIVE ELECTRON AFFINITY SURFACE

FIELD OF THE INVENTION

The present invention relates to infrared detection and imaging, and in particular, to infrared detectors that are sensitive to infrared radiation in the medium wavelength band, the long wavelength band or very long wavelength band, where such detectors employ multiple quantum well devices and are constructed in a photocathode architecture.

BACKGROUND OF THE INVENTION

In the field of infrared detection and imaging, several types of sensors or detectors are known. In each case, the purpose of the detector is to receive a non-visible photon in the medium wavelength infrared (MWIR), long wavelength infrared (LWIR), or very long wavelength infrared (VLWIR), and to convert that photon to either an electrical signal, which can be sensed, or to a visible wavelength photon, which can be perceived directly. In many applications, the infrared detectors are formed in arrays, often called focal plane arrays, which have a plurality of sensing elements so that information for many picture elements can be collected at one time. Such infrared detectors have been used in military and civilian night vision cameras for a variety of purposes.

Although mercury cadmium telluride (HgCdTe or MCT) photovoltic detectors have been used with high performance, recently quantum well infrared photodetector (QWIP) structures have been increasingly used in order to avoid the manufacturing difficulties that are associated with MCT. QWIP detectors are based on a layered structure generally containing a plurality of gallium arsenide (GaAs) layers alternating with a plurality of aluminum gallium arsenide (AlGaAs) layers. Although GaAs/AlGaAs has frequently been used in QWIPs, other materials can also be used. The GaAs/AlGaAs QUIP structure has significant producibility and uniformity advantages over photovoltic MCT devices.

Various designs for QWIP detectors are known. One article presenting such designs is "Quantum-Well Infrared Photodetectors," J. Appl. Phys. 74(8), Oct. 15, 1993, by B. F. Levine. FIG. 1(*a*), which will be described next, illustrates one such prior art QWIP.

Referring to FIG. 1(*a*), a prior art QWIP 10 comprises a GaAs substrate layer 30; an aluminum arsenide (AlAs) reflector layer 32, which is deposited on the GaAs substrate layer 30; an $N^+$ doped GaAs contact 34; a multiple quantum well (MQW) structure 36; and a reflective metalized diffraction grating 38. In this structure, the GaAs substrate 30 faces a scene to be imaged and receives photons which may have been collected and focused by an optical system (not shown). An incident photon 20 enters the GaAs substrate 30 from above and passes downwardly through the GaAs substrate 30, which is transparent in the infrared region, and enters into the MQW region 36 below.

The purpose of the MQW structure 36 is to absorb the photon 20 and to generate a current flow indicative of the absorbed incident infrared radiation. The MQW structure is shown in more detail in FIG. 1*b*. As shown in FIG. 1*b*, the MQW structure typically comprises a series of layers of Group III–V semiconductors. A QWIP can comprise, for example, alternating layers of GaAs quantum well layers and AlGaAs barrier layers, and may comprise approximately 50 layers of each. Note, in FIG. 1*b*, the GaAs quantum well layers and AlGaAs barrier layers are not individually numbered. Often, the GaAs quantum well layers are doped with an $n^-$ dopant, such as silicon, to provide electrons in the ground states of the wells for intersubband detection. When a bias voltage is applied across the MQW structure 36, electrons that are excited by the incident radiation are raised from the ground state energy level in the quantum well into the conduction band above the barrier heights, and can thus flow through the device.

Referring back to FIG. 1(*a*), the absorption of an incident photon 20 will be described further. In order for an incident photon to excite an electron in a quantum well, the electric field vector of the photon must be perpendicular to the barrier walls. Because the electric field vector for a light beam is normal to its direction of propagation, the direction of the electric field vector is parallel to the barrier walls for a light beam which is incident normal to the detector plane. Since such a light beam has no component of the electric field vector perpendicular to the barrier walls, no energy will be absorbed. To resolve this problem, a reflective metalized diffraction grating 38 is added to the MQW structure on the side of the QWIP which is opposite to the incident photon 20. The reflective diffraction grating 38 reflects and diffracts the incident normal photon 20 within the MQW structure 36. Reflected zeroth order diffraction mode radiation, indicated by arrow 24, is lost by the QWIP. However, higher order diffraction mode radiation, shown by arrows 26, has an electric field vector with a component perpendicular to the MQW barrier walls and can be absorbed. Thus, the reflective diffraction grating 38 substantially improves the absorption efficiency of the QWIP.

A second prior art QWIP 40 is shown in FIG. 2. Like the first prior art QWIP, the second prior art QWIP 40 comprises a multi-layer structure including a thin GaAs substrate 42, an $N^+$ doped GaAs contact 44, a multiple quantum well (MQW) structure 46, and a reflective metalized diffraction grating 48. The MQW structure 46 of the second prior art QWIP 40 is like the MQW structure 36 of the first prior art QWIP 10, and typically comprises a series of layers of Group III–V semiconductors. The reflective metalized diffraction grating 48 enhances absorption of the incident radiation. As previously described, a reflected zeroth order diffraction mode radiation, indicated by arrow 24, is lost by the QWIP. However, higher order diffraction mode radiation, shown by arrows 26, has an electric field vector with a component perpendicular to the MQW barrier walls and can be absorbed.

In either of the prior art detectors, QWIP 10 and QWIP 40, the quantum well layer and barrier layer can be optimized for LWIR detection. As shown in FIG. 3, for LWIR absorption, each MQW 36 and 46 can comprise approximately 25–50 pairs of layers, each pair comprising a layer of GaAs and a layer of $Al_xGa_{1-x}As$. Each GaAs well 50 has a thickness in the range of about 35 to about 50 Angstroms, and is doped n-type with a doping density of approximately $N_D$~$(0.2–1.5)\times10^{18}$ $cm^{-3}$. Each AlGaAs barrier layer 54 has a thickness in the range of about 300 to about 500 Angstroms, and is undoped $Al_xGa_{1-x}As$. For LWIR applications, x is typically in the range of about 0.26 to about 0.29. The MQW outer layers include contact layers 56 on either side of the $GaAs/Al_xGa_{1-x}As$ sandwich. Each contact layer 56 comprises an $N^+$ GaAs layer, which is highly doped n-type $N_D$~$2\times10^{18}$ $cm^{-3}$. Typically, each contact layer 56 has a thickness in the range of about 0.5 to about 1.0 $\mu$m. The MQW structure is epitaxially grown on a lattice matched GaAs substrate.

In each of the prior art QWIPs 10 and 40 described above, an incident photon energizes an electron in a quantum well and, under the influence of an applied bias, contributes to a current flow through the device. An indication of the magnitude of the infrared radiation on the QUIP can be found by measuring the thus induced photocurrent.

Also known in the prior art is the enhanced quantum well infrared photodetector (EQWIP), as described in U.S. Pat. No. 5,539,206, issued to Schimert, the entirety of which is incorporated herein by reference. FIGS. 4 and 5 illustrate the EQWIP. Referring to FIG. 4, a focal plane array using the EQWIP 60, comprises a multi-layer structure wherein a top MQW layer 61 is bonded via a series of indium bump bonds 62 to a readout integrated circuit (ROIC) 63. The top MQW layer 61 has a series of etched wells 64 which extend from the top surface down through a portion of the MQW layer. Each indium bump bond 62 electrically connects one pixel in the top MQW layer 61 to the ROIC 63 so that the signal from that pixel can be measured.

FIG. 5 illustrates a partial cross-section of the EQWIP 60 along the line 5—5 in FIG. 4. Referring to FIG. 5, the EQWIP 60 has a plurality of MQW structures 65A–65E formed above an N GaAs contact layer 66. Below the $N^+$ GaAs contact layer 66 is an Au reflector 67, with an electrical contact 68 disposed between a portion of the $N^+$ GaAs contact layer 66 and the Au reflector 67. The thickness of the Au reflector 67 is approximately 2,000 Angstroms, and the reflector 67 is formed on the side of contact layer 60 opposite from the MQW structures 65A–65E. Each of the MQW structures 65A–65E comprises a multilayered MQW portion 69, similar to that shown in FIG. 3, and a top N GaAs contact layer 56.

It should be noted that FIG. 5 illustrates one pixel element within the array of pixel elements in the focal plane array detector shown in FIG. 4. FIG. 5 is dimensioned in accordance with a detector tuned for optimum response to LWIR radiation having a wavelength in the 8–10 $\mu$m range. In this structure, the plurality of spaced apart vertically elongated MQW structures 65A–65E form a diffraction grating to diffract incident photons which may be incident normal to the detector surface so that they can be absorbed. Additionally, the multilayered MQW portion 69, of the elongated MQW structures 65A–65E, absorbs those incident photons that have a component of their electrical field vector perpendicular to the plane of the quantum well layers. Thus, the MQW structures 65A–65E of the EQWIP 60, perform the functions of the MQW infrared absorbing structure of the conventional QWIP 36, as well as the metalized diffraction grating 38 necessary to promote absorption of incident photons.

As with the prior art QWIPs 10 and 40 which were described above, in the EQWIP 60 an incident photon energizes an electron in a quantum well of the multilayered MQW portion 69 and, under the influence of an applied bias, the excited electron contributes to a current flow through the device. An indication of the magnitude of the infrared radiation on the QWIP can be found by measuring the thus induced photocurrent.

In addition to infrared detectors which generate a photocurrent in response to an incident photon, also known in the prior art are visible and infrared sensitive photocathodes. In general, a photocathode comprises a multilayered structure including a transparent substrate; an absorption layer, which absorbs an incident photon and which, upon absorption, converts the photon to an electron-hole pair; and an emission layer, having a negative electron affinity at the back side to emit the freed electron into a vacuum. Thus, an incident photon excites an electron in the absorption layer so that the electron is ejected from the structure into a vacuum. In detection systems using photocathodes, the ejected electron is often accelerated over some distance in the vacuum under the influence of an applied electric field to increase the electron's energy, and the thus accelerated electron is subsequently detected with a device such as a charge-coupled device (CCD) or microchannel plate with fluorescent screen.

FIG. 6 illustrates a semiconductor photocathode generally. Referring to FIG. 6, the semiconductor photocathode 70, comprises: a transparent P+ type semiconductor substrate 72, which receives an incident photon 73; an absorption layer 74, formed of P-type semiconductor material for converting a photon 73 to an electron-hole pair; a transport layer 75, which transports electrons which are liberated in the absorption layer 74 to subsequent layers; an electrode 76, for applying a bias voltage V between the substrate 72 and the electrode 76 so that an electric field can be created across the layers 72–76; and a negative electron affinity surface 77, which allows the transported electrons 78 to easily escape the material and be emitted into the vacuum 79.

Also known in the prior art is an infrared photocathode detector which uses an $InAs/Ga_wIn_yAl_{1-y-w}As$ type II superlattice for an infrared absorbing layer, where w+y<1 and where w and y define the mole fraction of Ga, In and Al. In the type II superlattice, coupling between closely spaced material layers creates an effective direct bandgap due to allowed conduction and valence band states. Unlike the QWIP, the superlattice absorber can absorb light from any angle relative to the semiconductor surface.

As illustrated by the foregoing discussion, a plurality of types of infrared detector structures are known. In the general field of detector development, the current objectives are to increase the performance of detectors, decrease difficulties in manufacturing, and reduce the cost of producing detectors. In view of the desirable manufacturing qualities of the QWIP and EQWIP over MCT, infrared detectors based on a QWIP or EQWIP structure have potential cost advantages.

SUMMARY OF THE INVENTION

A first embodiment of the invention, as illustrated in a preferred embodiment, is a quantum well infrared photodetector (QWIP) photocathode infrared sensor which includes a top $N^+$ GaAs contact layer, a multiple quantum well (MQW) photon absorbing layer having several periods of GaAs/AlGaAs layers, a bottom $N^+$ GaAs contact layer, and a negative electron affinity surface on the bottom $N^+$ GaAs contact layer opposite the multiple quantum well layer to facilitate ejection of a liberated electron into a vacuum. In this embodiment, the top $N^+$ GaAs contact layer includes a transmissive diffraction grating to diffract incident photons so that the incident photons arriving normal to the detector surface will be diffracted to a path which is not normal to the detector surface and thus will be absorbed in the multiple quantum well layers.

In a second embodiment of the present invention, the photocathode infrared sensor includes an enhanced quantum well infrared photodetector (EQWIP) structure as the photon absorbing layer. In the second embodiment of the present invention, the elongate MQW elements of the EQWIP form a photon absorbing structure as well as a diffraction grating for diffracting incoming photons.

In an additional aspect of the present invention, an electron detector, such as a photomultiplier, dynode, charge-coupled device (CCD), or microchannel plate with fluorescent screen, is coupled with the photocathode to provide an infrared detection system including specific means to detect the liberated electrons. Based on the type of electron detector used, the photocathode infrared sensor of the present invention may be used in either a photo-detection scheme or an imaging scheme. In a photo-detection scheme, liberated electrons are detected without regard to the spatial position of the incident photon on the photocathode. In an imaging scheme, a one or two dimensional position of each liberated electron is recorded so that the scene imaged can be constructed.

BRIEF DESCRIPTION OF THE DRAWINGS

A more complete understanding of the present invention and its advantages will be readily apparent from the following Detailed Description taken in conjunction with the accompanying drawings. Throughout the accompanying drawings, like parts are designated by like reference numbers.

FIG. 1(*b*) is an enlarged partial cross-sectional view of a prior art QWIP showing details of the MQW absorbing layer.

DETAILED DESCRIPTION OF THE PREFERRED EMBODIMENTS

Figure 7:
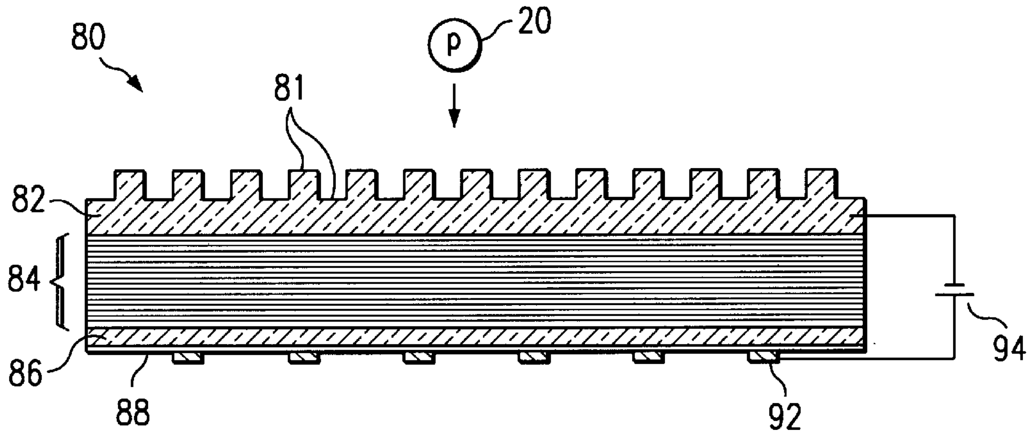
FIG. 7 is a cross-sectional view of a QWIP photocathode of the present invention according to a first embodiment.

FIG. 7 illustrates an infrared photocathode according to a first embodiment of the present invention. Photocathode 80, comprises: a top $N^+$ GaAs contact layer 82, to receive an incident photon 20; a semiconductor multiple quantum well (MQW) structure 84, which is fabricated on one surface of the top $N^+$ GaAs contact layer; and a bottom $N^+$ GaAs contact layer 86, which is fabricated on the multiple quantum well layer structure. A negative electron affinity surface 88 is formed on the surface of the bottom $N^+$ GaAs contact layer 86 opposite from the multiple quantum well structure 84. Also fabricated on the surface of the bottom $N^+$ GaAs contact layer 86 opposite from the multiple quantum well structure 84 is a metal electrode grid 92 which is provided so that an absorption bias 94 can be applied across the layers of the structure. The top $N^+$ GaAs contact layer 82 has formed on it a transmissive diffractive grating 81 to diffract incident photons 20.

In the above-described structure, it should be noted that although top $N^+$ GaAs contact layer 82 and bottom $N^+$ GaAs contact layer 86 are referred to using terms of orientation, i.e., "top" and "bottom", such terms are used herein merely to distinguish the contact layers 82 and 86 from each other and should not be construed as limitations. Additionally, although the metal electrode grid 92 extends across the surface of the bottom $N^+$ GaAs contact layer 86, the metal lines comprising the electrode grid 92 cover only a small percentage of the surface area of the bottom $N^+$ GaAs contact layer 86.

One advantage of a photocathode architecture over the conventional MCT and QWIP/EQWIP detectors described above, is that the photocathode detector does not need to make a physical electrical connection to each individual IR absorber (pixel) in order to detect the induced photocurrent. Often, the above-described conventional detectors are bump bonded to a readout IC in order to provide an electrical connection to each individual IR detector. The bump bonding process adds complexity and additional steps to the manufacturing process.

A second advantage of the photocathode architecture over the conventional ACT and QWIP/EQWIP detectors is that the conventional detectors must be formed from a multitude of electrically-isolated IR detecting pixels in order to form a focal plane array capable of producing image data in an array of picture elements. A photocathode absorber, in contrast, does not need to be subdivided into electrically discrete pixels. In a photocathode, the incoming IR energy from an image scene is divided into spatially arrayed picture elements by the electron detection device, such as a CCD. Where a multi-pixel focal plane array is made using a photocathode, a large, planar photocathode is fabricated and placed above the surface of a CCD having multiple pixel elements. In operation, each electron that is ejected from the backside of the photocathode, is ejected in close proximity to the location where the incident photon 20 strikes the top transparent P+ type semiconductor substrate 72. Thus, the specific CCD pixel which detects a free electron spatially corresponds to the location on the photocathode where the IR photon 20 was originally incident. For this reason, a multi-pixel photocathode-based detector is possible without the necessity of dividing the photocathode layer into a plurality of electrically isolated pixels.

First Embodiment

Next, fabrication will be described of the quantum well infrared photocathode according to the first embodiment. In general, fabrication techniques used for building the quantum well infrared photocathode are well known, so extensive details will be omitted.

The quantum well infrared photocathode of the present invention is preferably fabricated by depositing a series of material layers onto a GaAs substrate. First a GaAs substrate having a thickness on the order of 600 μm is provided and an etch stop layer of AlGaAs approximately 1000 Angstroms thick is deposited on the GaAs substrate. The GaAs substrate together with the etch stop layer provide a foundation upon which the quantum well infrared photocathode is formed.

The layers which are formed on top of the GaAs substrate to fabricate the quantum well infrared photocathode are shown in FIG. 7; however, the GaAs substrate and AlGaAs etch stop layers are not shown in FIG. 7. The order of fabrication steps will be described next in reference to FIG. 7. Having formed the etch stop layer, next a bottom $N^+$ GaAs contact layer 86 having a thickness of approximately 1,000–4,000 Angstroms is deposited. The bottom $N^+$ GaAs contact layer 86 comprises an $N^+$ GaAs layer which is highly doped n-type $N_D \sim 2 \times 10^{18}$ $cm^{-3}$. Following the deposition of the bottom $N^+$ GaAs contact layer 86, a multiple quantum well structure 84 is fabricated. The multiple quantum well structure 84 is fabricated by depositing a plurality of alternating GaAs layers and $Al_xGa_{1-x}As$ layers. The GaAs layers and $Al_xGa_{1-x}As$ layers may be fabricated by molecular beam epitaxy (MBE), or metal-organic chemical vapor deposition (MOCVD), or other methods known in the art. In a preferred embodiment, approximately 25–50 layers each of GaAs quantum wells and AlGaAs barrier layers are formed, with GaAs quantum well layers and AlGaAs barrier layers being deposited in alternating succession. Each GaAs well has a thickness in the range of about 35 to about 50 Angstroms, and is doped n-type with a doping density of approximately $N_D \sim (0.2–1.5) \times 10^{18}$ $cm^{-3}$. Each $Al_xGa_{1-x}As$ barrier has a thickness in the range of about 300 to about 500 Angstroms, and is undoped $Al_xGa_{1-x}As$. For LWIR applications, x is typically in the range of approximately 0.26 to approximately 0.29. After depositing a suitable number, e.g., 25–50 periods of GaAs/$Al_xGa_{1-x}As$, a top $N^+$ GaAs contact layer 82 is deposited on the multiple quantum well structure 84 by a well-known method such as MBE or MOCVD. The top $N^+$ GaAs contact layer 82 has a thickness in the range of about 1.0 to about 1.5 $\mu$m.

After the top $N^+$ GaAs contact layer 82 has been deposited, the transmissive diffractive grating 81 is formed on the top $N^+$ GaAs contact layer 82. In a preferred embodiment, the transmissive diffractive grating 81 is formed as a series of etched steps in the top $N^+$ GaAs contact layer 82. To form the etched steps, the top $N^+$ GaAs contact layer 82 is patterned with photoresist and the steps are formed by a well-known etching process.

After etching the transmissive diffractive grating 81, the sandwich structure is turned over and the surface of the top $N^+$ GaAs contact layer 82 having the transmissive diffractive grating 81 formed therein is secured to a carrier by a temporary method such as by wax bonding. With the structure wax mounted on a carrier, the GaAs substrate is thinned by mechanical processes such as by lapping, and the thinned GaAs substrate is then removed down to the etch stop layer by a process such as reactive ion etching (RIE). Once the etch stop layer is exposed by the removal of the GaAs substrate, the etch stop layer is removed by a selective etch thereby exposing the bottom $N^+$ GaAs a contact layer 86. After exposing the bottom $N^+$ GaAs contact layer 86, a metal electrode grid 92 is deposited on the surface of the bottom $N^+$ GaAs contact layer 86 by a well-known metal deposition process. Lastly, the bottom $N^+$ GaAs contact layer 86 is treated at the surface to form a negative electron affinity surface 88. The negative electron affinity surface 88 is formed by a standard method of heat cleaning followed by deposition of monolayers of Cs and oxidized cesium. Such a negative electron affinity surface is also referred to as a cesiated negative electron affinity surface.

In the above-described preferred embodiment, the metal electrode grid 92 is deposited prior to forming the negative electron affinity surface 88. It will be appreciated, however, that the negative electron affinity surface 88 could be formed prior to deposition of the metal electrode grid 92 so long as the deposition and patterning process does not damage the cesiated surface.

Figure 8:
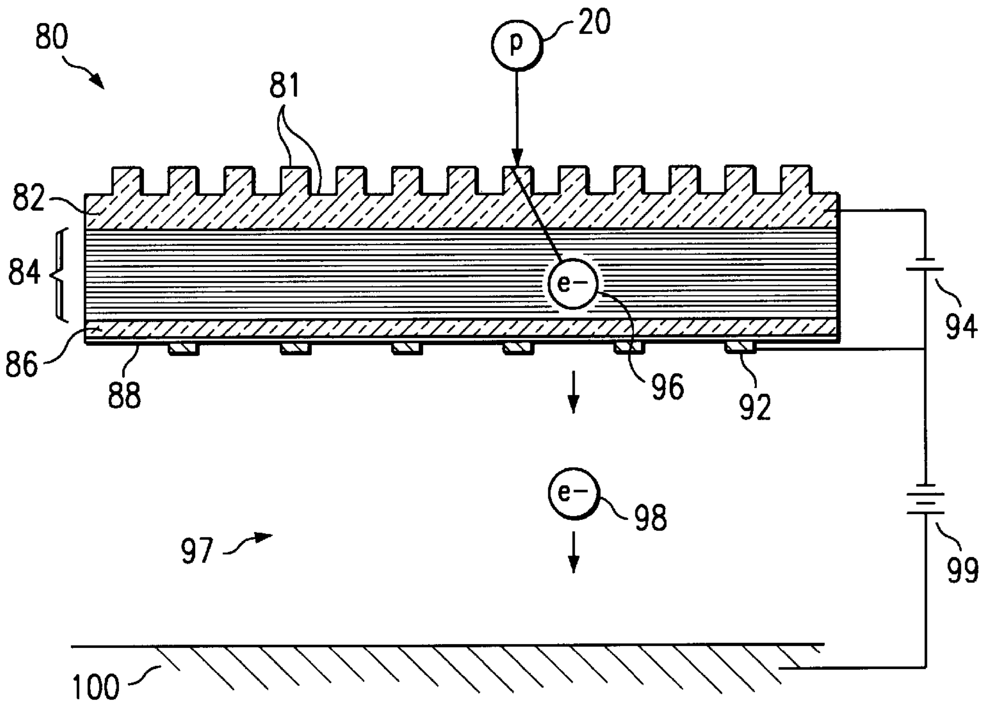
FIG. 8 is a cross-sectional view of a QWIP photocathode of the present invention according to the first embodiment, shown together with an electron absorbing structure and illustrating the absorption of an infrared photon and the emission of a free electron from the photocathode.

Next, detection of an incident photon 20 will be described for a preferred embodiment of the present invention by reference to FIG. 8. An incident photon 20, which may be directed onto the photocathode by an optic system or other means, strikes the transmissive diffractive grating 81 formed in the top $N^+$ GaAs contact layer 82 and is scattered into the bulk of the top $N^+$ GaAs contact layer 82. The top $N^+$ GaAs contact layer 82 is transparent in the LWIR spectrum, so the photon 20 passes through the top $N^+$ GaAs contact layer 82 and enters into the multiple quantum well structure 84. For a photon having a component of its electric field vector perpendicular to the barrier walls, the photon 20 can be absorbed and excite an electron 96 in a quantum well. When the photon 20 is absorbed, the electron 96 is excited to a higher energy state, nominally to an energy state of the barrier. An electric field, impressed across the photocathode 80 by absorption bias 94, drives the excited electron 96 to the bottom $N^+$ GaAs contact layer 86. Typically, the applied absorption bias 94 is on the order of 1–2 volts and is applied between the top $N^+$ GaAs contact layer 82 and the metal electrode grid 92. When the liberated electron 96 reaches the cesiated negative electron affinity surface 88 of bottom $N^+$ GaAs contact layer 36, the cesium treatment allows the electron 96 to easily escape the surface 88. In order to detect the photogenerated electron 96, the electron that escapes the back surface 98 is accelerated in a vacuum 97 by an acceleration bias 99 so that its energy level is increased, and the thus accelerated electron is detected with an electron detector 100, such as a photomultiplier, dynode, charge-coupled device (CCD), or microchannel plate with fluorescent screen. The metal electrode grid 92 does not block the electron 96 from escaping the surface because the metal lines comprising the metal electrode grid 92 cover only a small percent of the surface area of the bottom $N^+$ GaAs contact layer 86.

Figure 1A:
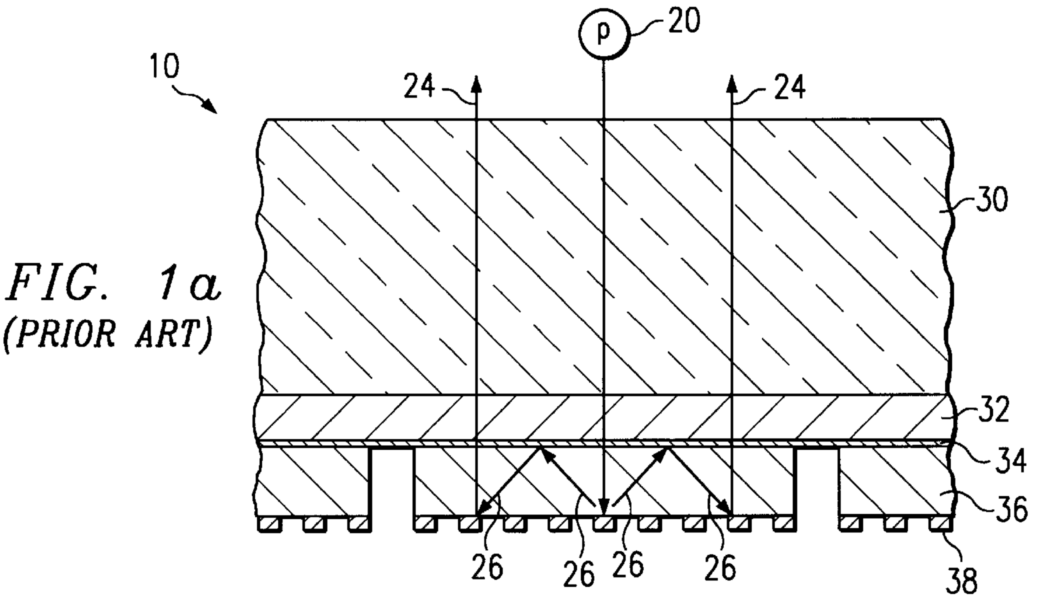
FIG. 1a (PRIOR ART)
FIG. 1(*a*) is a cross-sectional view of a prior art QWIP having a bottom surface metalized diffraction grating and a GaAs substrate.
Figure 2:
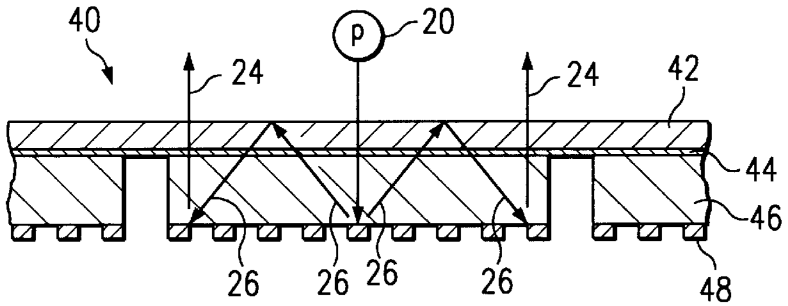
FIG. 2 (PRIOR ART)
FIG. 2 is a cross-sectional view of a prior art QWIP having a thin top surface contact layer and a bottom surface metalized diffraction grating.
Figure 1B:
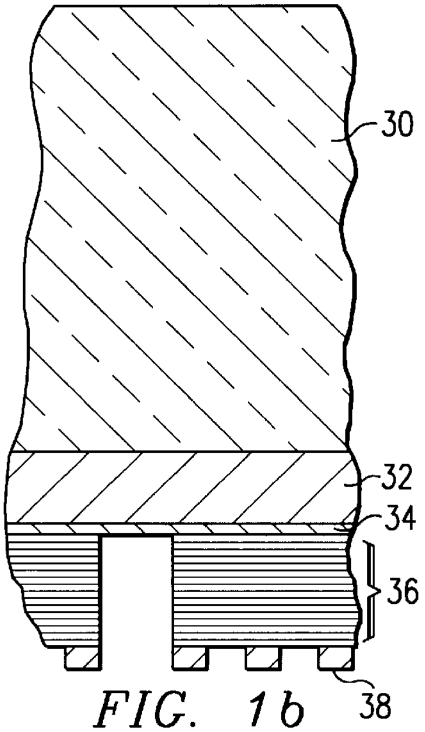
FIG. 1b (PRIOR ART)
Figure 3:
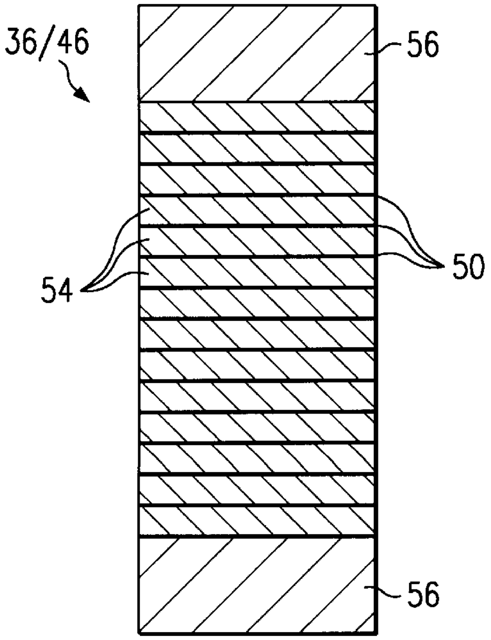
FIG. 3 (PRIOR ART)
FIG. 3 is an enlarged cross-sectional view of an MQW absorbing layer showing details of the top and bottom contact layers as well as details of the multiple quantum well and the quantum barrier layers.
Figure 4:
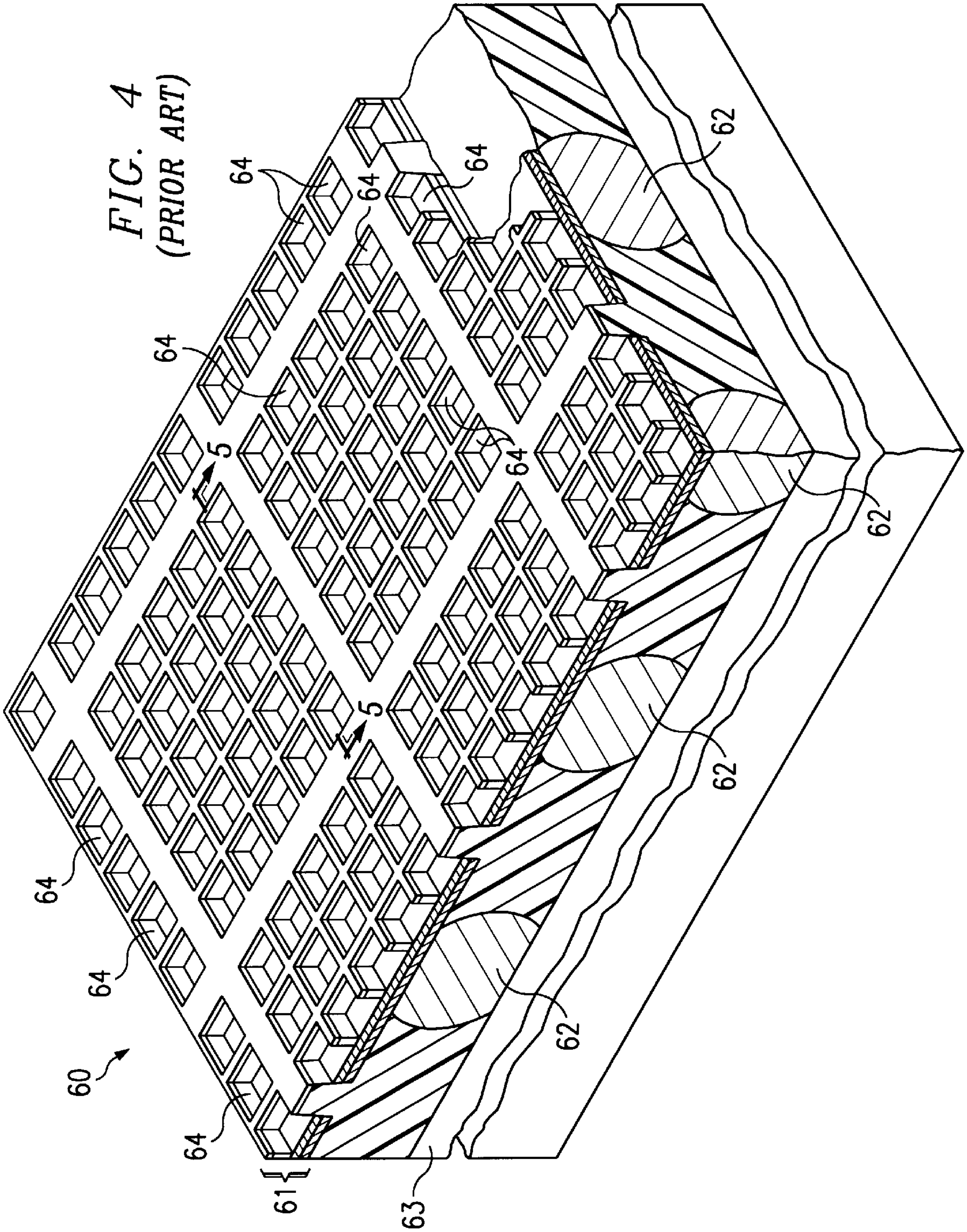
FIG. 4 (PRIOR ART)
FIG. 4 is a perspective view, partly sectioned, of a prior art multi-pixel focal plane array based on an EQWIP detection structure bonded to a readout integrated circuit.

It should be noted that the transmissive diffractive grating 81 formed in the top $N^+$ GaAs contact layer 82 is unlike the reflective metalized diffraction grating 38 of the prior art QWIP shown in FIG. 1. Although the purpose of both the transmissive diffractive grating 81 and the reflective metalized diffraction grating 38 is to scatter an incident photon to assist in its absorption, the transmissive diffractive grating 81 of the present invention is a transmissive structure on the top $N^+$ GaAs contact layer 82 upon which an incident photon first strikes. The transmissive structure may include structures such as a metal grating, an etched diffraction grating, or an etched random scattering surface. In contrast, the reflective metalized diffraction grating 38 of the prior art QWIP is a metal coating formed on a bottom surface of the QWIP, as shown in FIG. 1. The metalized diffraction grating 38 internally reflects and diffracts a photon which has already passed through the QWIP structure.

The transmissive diffractive grating 81 of the present invention is formed in the top $N^+$ GaAs contact layer 82 and diffracts a light wave entering the diffractive pattern. Because the photon is diffracted by the grating, the photon may be deflected at an angle which may be more likely to cause photon absorption. The transmissive diffraction grating 81 may be formed on the surface of the top $N^+$ GaAs contact by the same types of equipment that are used to make integrated circuits. For the etched pattern, the size and proximity of the steps to each other determines how the incoming light is affected.

For a photocathode optimized for detection of LWIR, an etched transmissive diffractive grating 81 in the top $N^+$ GaAs contact layer 82 can be formed in a series of steps, each step being approximately 0.5 μm high, approximately 1.5 μm wide, and spaced with a period of approximately 3.0 μm.

Not only are the metalized diffraction grating 38 and transmissive diffractive grating 81 formed differently, a prior art QWIP detector with a bottom-side reflective metalized diffraction grating 38 would not be effective in a photocathode detector architecture. In a photocathode, the bottom contact must permit the liberated electron to freely pass out of the structure into a vacuum. A bottom-side reflective metalized diffraction grating 38, however, would prevent the electron from passing out of the structure. Additionally, the reflective metalized diffraction grating 38 of a conventional QWIP could not merely be moved to the top GaAs substrate layer 30 in order to build a photocathode detector, because the reflective metal coating would prevent incident photons from entering into the top GaAs substrate layer 30 for detection. Thus, in order to build a QWIP photocathode detector, a photon scattering mechanism must be provided that allows an incident photon to pass easily into the structure, which scatters the photon to promote absorption in the MQW layers, and which allows the liberated electron to pass freely from the structure at the bottom side. The disclosed structures, including a metal grating, an etched diffraction grating, and an etched random scattering surface formed in the top $N^+$ GaAs contact layer 82 of the present invention meet these requirements.

In the case of using a CCD for the electron detector 100, the accelerated electron strikes the CCD and, due to the increase in energy obtained by the acceleration, is able to create a plurality of electron-hole pairs in the CCD. Because many electron-hole pairs are created in the CCD upon impact, the induced signal in the CCD is above the signal-to-noise ratio of the CCD and can be discerned. The CCD then creates an image, based on the location and frequency of the photoelectron strikes, which is read out of the CCD for further processing.

Second Embodiment

Figure 5:
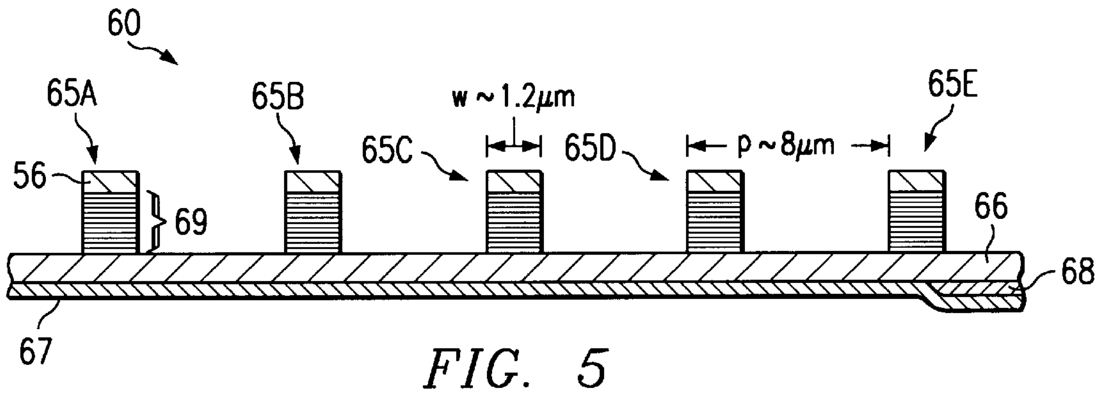
FIG. 5 (PRIOR ART)
FIG. 5 is a cross-sectional view of the EQWIP focal plane array taken along line 5—5 of FIG. 4.
Figure 6:
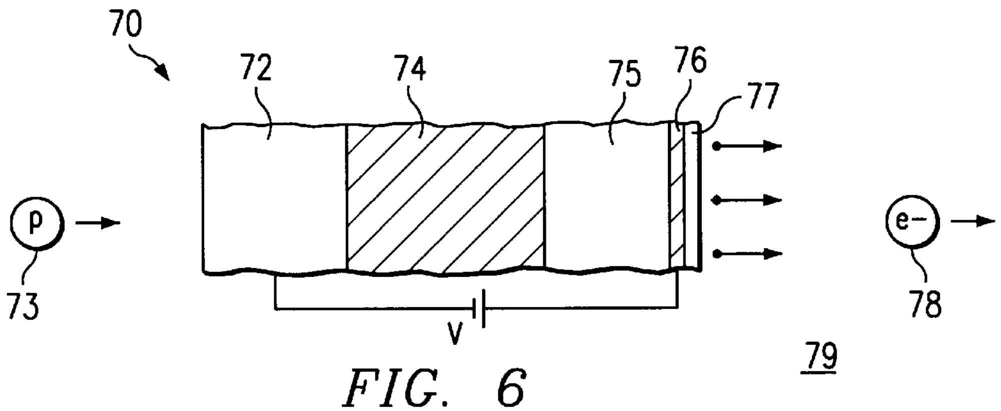
FIG. 6 (PRIOR ART)
FIG. 6 is a cross-sectional view of a generic photocathode structure showing a photon absorbing layer and a liberated electron.
Figure 9:
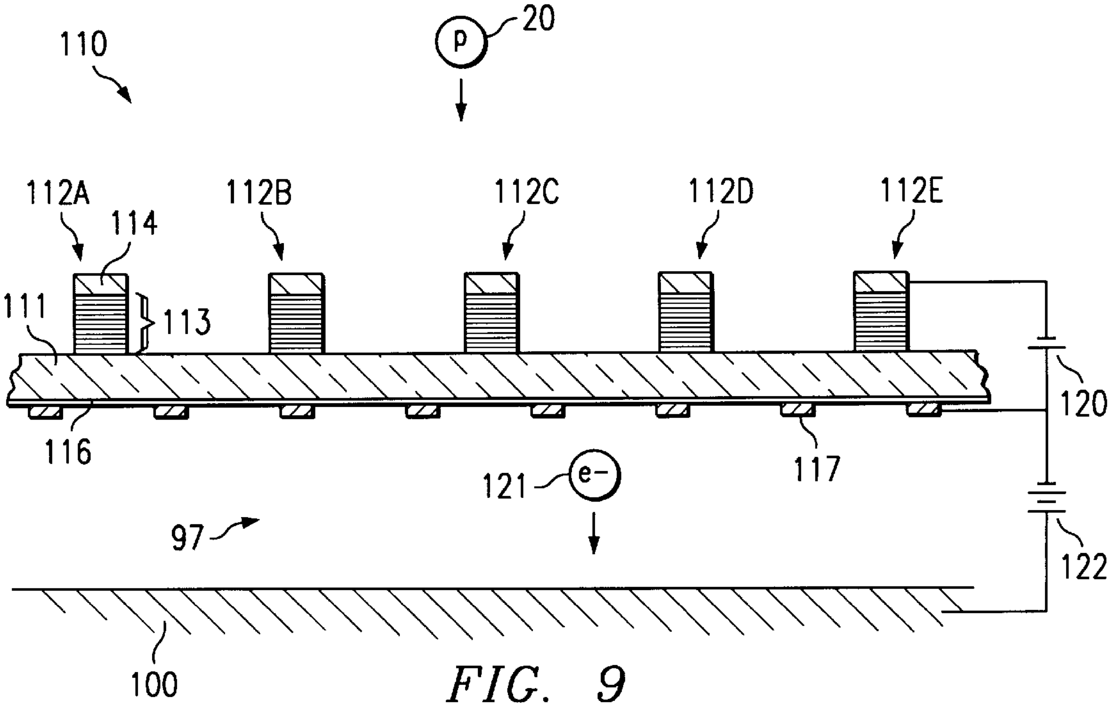
FIG. 9 is a cross-sectional view of an EQWIP photocathode of the present invention according to a second embodiment, shown together with an electron absorbing structure and illustrating the absorption of an infrared photon and the emission of a free electron from the photocathode.

FIG. 9 illustrates a small area of a second embodiment of the present invention. As shown in FIG. 9, the photocathode 110, comprises the bottom $N^+$ GaAs contact layer 111, upon which are formed a plurality of MQW structures 112–112E. Each of the MQW structures 112–112E is structurally similar to the MQW structures 65A–65E described with reference to FIG. 5, and includes a multilayered MQW portion 113 and top $N^+$ GaAs contact layer 114. The multilayered MQW portion 113 comprises approximately 25–50 layers each of GaAs quantum wells and AlGaAs barrier layers, with GaAs quantum well layers and AlGaAs barrier layers deposited in alternating succession. Each GaAs well has a thickness in the range of about 35 to about 50 Angstroms, and is doped n-type with a doping density of approximately $N_D \sim (0.2–1.5) \times 10^{18}$ $cm^{-3}$. Each $Al_xGa_{1-x}As$ barrier has a thickness in the range of about 300 to about 500 Angstroms, and is undoped $Al_xGa_{1-x}As$. For LWIR applications, x is typically in the range of approximately 0.26 to approximately 0.29.

As previously described in reference to the EQWIP detector, each of the MQW structures 112–112E performs the dual functions of forming a diffraction grating for diffracting an incident photon so that it will be scattered in the structure, as well as the function of absorbing those photons having a component of their electric field vector perpendicular to the barrier walls.

Formed on the bottom side of the bottom $N^+$ GaAs contact layer 111 is a metal electrode grid 117, so that an absorption bias 120 can be applied across the layers of the structure. The bottom side of the bottom $N^+$ GaAs contact layer 111 is processed by the standard method of heat cleaning followed by deposition of monolayers of Cs and oxidized cesium, to form a negative electron affinity surface 116.

The EQWIP photocathode 110 of the second embodiment is fabricated in a manner similar to the above-described first embodiment. Accordingly, extensive details are omitted. The MQW structures 112–112E are formed by depositing the MQW 113 and top contact 114 layers on the bottom $N^+$ GaAs contact layer 111, and then etching down through both the top contact layer 114 and MQW layer 113 to the bottom $N^+$ GaAs contact layer 111 to form the separated MQW structures 112–112E.

In the EQWIP photocathode 110, an incident photon 20 is diffracted by the diffraction grating formed from the plurality of MQW structures 112–112E and may be absorbed in a quantum well layer of the multilayered MQW portion 113. For an absorbed photon, the photon energizes an electron in a quantum well of the multilayered MQW portion 113 and, under the influence of an applied absorption bias 120, the excited electron is driven to the bottom $N^+$ GaAs contact layer 111. Typically, the applied absorption bias 120 is on the order of 1–2 volts and is applied between the top $N^+$ GaAs contact layer 114, and the metal electrode grid 117. When the liberated electron reaches the cesiated negative electron affinity surface 116 of bottom $N^+$ GaAs contact layer 111, the cesium treatment allows the electron to easily escape the surface 116. In order to detect the photogenerated electron, the electron that escapes the back surface 121 is accelerated in the vacuum 97 by an acceleration bias 122 so that its energy level is increased, and the thus accelerated electron is then detected with an electron detector 100, such as a photomultiplier, dynode, charge-coupled device (CCD), or microchannel plate with fluorescent screen.

Although the above-described first and second preferred embodiments have been described using a GaAs substrate, $N^+$ GaAs contact layers, and multilayered MQW portions comprising a plurality of periods of $GaAs/Al_xGa_{1-x}As$, it will be apparent to those skilled in the art that other materials such as InGaAs, InAlAs, and InP can be substituted.

Although the present invention has been fully described by way of examples and with reference to the accompanying drawings, it is to be understood that various changes and modifications will be apparent to those skilled in the art without departing from the spirit and scope of the invention. Therefore, unless such changes and modifications depart from the scope of the present invention, they should be construed as being included therein.

What is claimed is:

1. A quantum well photocathode comprising:

a first contact layer;

a multiple quantum well infrared absorbing layer disposed on said first contact layer;

a second contact layer disposed on said multiple quantum well infrared absorbing layer;

an electron ejecting layer; and an electrode for receiving an absorption bias voltage applied between said electrode and said first contact layer;

said electron ejecting layer disposed on at least a portion of said second contact layer, said electrode being disposed on at least a portion of one of said second contact layer and said electron ejecting layers;

wherein at least one of said first contact layer and said multiple quantum well infrared absorbing layer includes a diffracting surface for diffracting infrared radiation incident on said quantum well photocathode; and wherein said quantum well photocathode in constructed so that infrared radiation that is incident thereon is absorbed in said multiple quantum well infrared absorbing layer by exciting electrons from a ground state subband to an excited state subband.

2. A quantum well photocathode in accordance with claim 1, wherein said first contact layer includes said diffracting surface.

3. A quantum well photocathode in accordance with claim 2, wherein said diffracting surface is formed by a plurality of spaced apart etched steps in a surface of said first contact layer.

4. A quantum well photocathode in accordance with claim 1, wherein said first contact layer and said multiple quantum well infrared absorbing layer include said diffracting surface.

5. A quantum well photocathode in accordance with claim 1, wherein said electrode is disposed on at least a portion of said second contact layer.

6. A quantum well photocathode in accordance with claim 1, wherein said electrode is disposed on at least a portion of said electron ejecting layer.

7. A quantum well photocathode in accordance with claim 1, wherein said electrode is a conductive grid, said grid including a plurality of conductive lines, an area of said plurality of lines comprising a fraction of an area of said second contact layer.

8. A quantum well photocathode in accordance with claim 1, wherein said multiple quantum well infrared absorbing layer comprises a plurality of alternating layers of GaAs and $Al_xGa_{1-x}As$, wherein x is <1.

9. A quantum well photocathode in accordance with claim 8, wherein each of said GaAs layers has a thickness in the range of about 35 to about 50 Angstroms and is doped n-type, and wherein each of said $Al_xGa_{1-x}As$ layers has a thickness in the range of about 300 to about 500 Angstroms and is undoped $Al_xGa_{1-x}As$.

10. A quantum well photocathode in accordance with claim 1, wherein said multiple quantum well infrared absorbing layer comprises a plurality of alternating layers of InP and $In_xGa_{1-x}As$, wherein x is <1.

11. A quantum well photocathode in accordance with claim 10, wherein each of said $In_xGa_{1-x}As$ layers has a thickness in the range of about 35 to about 50 Angstroms and is doped n-type, and wherein each of said InP layers has a thickness in the range of about 300 to about 500 Angstroms and is undoped InP.

12. An infrared radiation detector comprising:

a quantum well photocathode which ejects electrons upon absorption of infrared radiation; and an electron detector, positioned adjacent to and spaced apart from said quantum well photocathode, for detecting said ejected electrons;

wherein said quantum well photocathode is constructed so that infrared radiation that is incident thereon is absorbed by exciting electrons from a ground state subband to an excited state subband, and wherein said quantum well photocathode includes a diffracting surface for diffracting infrared radiation incident on said quantum well photocathode.

13. An infrared radiation detector in accordance with claim 12, wherein said quantum well photocathode has a first surface and a second surface opposite said first surface, and wherein said quantum well photocathode is adapted to receive an absorption bias voltage between said first surface and said second surface;

wherein said quantum well photocathode and said electron detector are adapted to receive an acceleration bias voltage between said second surface of said quantum well photocathode and said electron detector; and wherein said second surface of said quantum well photocathode faces said electron detector.

14. An infrared radiation detector in accordance with claim 12, wherein said quantum well photocathode includes a multiple quantum well infrared absorbing layer.

15. An infrared radiation detector in accordance with claim 14, wherein said multiple quantum well infrared absorbing layer includes a plurality of alternating layers of GaAs and $Al_xGa_{1-x}As$, wherein x is <1.

16. An infrared radiation detector in accordance with claim 15, wherein each of said GaAs layers has a thickness in the range of about 35 to about 50 Angstroms and is doped n-type, and wherein each of said $Al_xGa_{1-x}As$ layers has a thickness in the range of about 300 to about 500 Angstroms and is undoped $Al_xGa_{1-x}As$.

17. An infrared radiation detector in accordance with claim 16, wherein x is in the range of about 0.26 to about 0.29.

18. An infrared radiation detector in accordance with claim 14, wherein said multiple quantum well infrared absorbing layer includes a plurality of alternating layers of InP and $In_xGa_{1-x}As$, wherein x is <1.

19. An infrared radiation detector in accordance with claim 18, wherein each of said $In_xGa_{1-x}As$ layers has a thickness in the range of about 35 to about 50 Angstroms and is doped n-type, and wherein each of said InP layers has a thickness in the range of about 300 to about 500 Angstroms and is undoped InP.

20. An infrared radiation detector in accordance with claim 12, wherein said electron detector is a device selected from the group consisting of a photomultiplier, a dynode, a charge-coupled device and a microchannel plate.

21. An infrared radiation detector in accordance with claim 12, wherein said quantum well photocathode includes a first contact layer on a side facing incident infrared radiation, said first contact layer including said diffracting surface.

22. An infrared radiation detector in accordance with claim 21, wherein said diffracting surface is formed by a plurality of spaced apart etched steps in a surface of said first contact layer.

23. An infrared radiation detector in accordance with claim 12, wherein said first contact layer and said multiple quantum well infrared absorbing layer includes said diffracting surface.

24. An enhanced quantum well photocathode comprising:

a first contact layer having first and second opposing sides;

a plurality of elongate multiple quantum well infrared radiation absorbing elements having opposed first and second longitudinal surfaces disposed on said first contact layer, said first longitudinal surface of each of said elongate multiple quantum well infrared radiation absorbing elements being in contact with said first surface of said first contact layer, said plurality of elongate multiple quantum well elements comprising a diffraction grating for incident infrared radiation;

said second longitudinal surface of each of said elongate multiple quantum well infrared radiation absorbing elements having a second contact layer disposed thereon;

an electrode for receiving an absorption bias voltage applied between said electrode and said second contact layer disposed on said second longitudinal surface of each of said elongate multiple quantum well infrared radiation absorbing elements; and a negative electron affinity surface disposed on at least a portion of said second side of said first contact layer, said electrode being disposed on at least a portion of one of said second side of said first contact layer and said negative electron affinity surface;

wherein said quantum well photocathode is constructed so that infrared radiation that is incident thereon is absorbed in said elongate multiple quantum well infrared absorbing elements by exciting electrons from a ground state subband to an excited state subband, and wherein said negative electron affinity surface ejects electrons from said excited state subband.

25. An enhanced quantum well photocathode as claimed in claim 24, wherein said elongate multiple quantum well infrared radiation absorbing elements are periodically spaced.

26. An enhanced quantum well photocathode as claimed in claim 24, wherein said elongate multiple quantum well infrared radiation absorbing elements have a linear configuration.

27. An enhanced quantum well photocathode as claimed in claim 24, wherein said electrode is disposed on at least a portion of said first contact layer.

28. An enhanced quantum well photocathode as claimed in claim 24, wherein said electrode is a conductive grid, said grid including a plurality of conductive lines, an area of said plurality of lines comprising a fraction of an area of said first contact layer.

29. An enhanced quantum well photocathode in accordance with claim 24, wherein each of said elongate multiple quantum well infrared radiation absorbing elements comprises a plurality of alternating layers of GaAs and $Al_xGa_{1-x}As$, wherein x is <1.

30. An enhanced quantum well photocathode in accordance with claim 29, wherein each of said GaAs layers has a thickness in the range of about 35 to about 50 Angstroms and is doped n-type, and wherein each of said $Al_xGa_{1-x}As$ layers has a thickness in the range of about 300 to about 500 Angstroms and is undoped $Al_xGa_{1-x}As$.

31. An enhanced quantum well photocathode in accordance with claim 24, wherein each of said elongate multiple quantum well infrared radiation absorbing elements comprises a plurality of alternating layers of InP and $In_xGa_{1-x}As$, wherein x is <1.

32. An enhanced quantum well photocathode in accordance with claim 31, wherein each of said $In_xGa_{1-x}As$ layers has a thickness in the range of about 35 to about 50 Angstroms and is doped n-type, and wherein each of said InP layers has a thickness in the range of about 300 to about 500 Angstroms and is undoped InP.

33. A quantum well photocathode comprising:

a diffraction grating;

a first contact layer disposed on said diffraction grating;

a multiple quantum well infrared absorbing layer disposed on said first contact layer;

a second contact layer disposed on said multiple quantum well infrared absorbing layer;

an electron ejecting layer; and an electrode for receiving an absorption bias voltage applied between said electrode and said first contact layer;

said electron ejecting layer disposed on at least a portion of said second contact layer, said electrode being disposed on at least a portion of one of said second contact layer and said electron ejecting layer;

wherein said quantum well photocathode is constructed so that infrared radiation that is incident thereon is absorbed in said multiple quantum well infrared absorbing layer by exciting electrons from a ground state subband to an excited state subband.

34. A quantum well photocathode in accordance with claim 33, wherein said diffraction grating is formed by a plurality of periodically spaced metal strips.

35. An infrared radiation detector comprising:

a quantum well photocathode which ejects electrons upon absorption of infrared radiation; and an electron detector, positioned adjacent to and spaced apart from said quantum well photocathode, for detecting said ejected electrons;

wherein said quantum well photocathode is constructed so that infrared radiation that is incident thereon is absorbed by exciting electrons from a ground state subband to an excited state subband, and wherein said quantum well photocathode includes a diffraction grating for diffracting infrared radiation incident on said quantum well photocathode.

36. An infrared radiation detector in accordance with claim 35, wherein said quantum well photocathode has a first surface and a second surface opposite said first surface, and wherein said quantum well photocathode is adapted to receive an absorption bias voltage between said first surface and said second surface;

wherein said quantum well photocathode and said electron detector are adapted to receive an acceleration bias voltage between said second surface of said quantum well photocathode and said electron detector; and wherein said second surface of said quantum well photocathode faces said electron detector.

37. An infrared radiation detector in accordance with claim 35, wherein said quantum well photocathode includes a multiple quantum well infrared absorbing layer.

38. An infrared radiation detector in accordance with claim 35, wherein said quantum well photocathode includes a first contact layer on a side facing said incident infrared radiation, said diffraction grating being disposed on said first contact layer on a side facing said incident radiation.

39. An infrared radiation detector in accordance with claim 35, wherein said diffraction grating is formed by a plurality of periodically spaced metal strips.

40. A quantum well photocathode comprising:

a first contact layer;

a multiple quantum well infrared absorbing layer disposed on said first contact layer;

a second contact layer disposed on said multiple quantum well infrared absorbing layer;

an electron ejecting layer; and an electrode for receiving an absorption bias voltage applied between said electrode and said first contact layer;

said electron ejecting layer disposed on at least a portion of said second contact layer, said electrode being disposed on at least a portion of one of said second contact layer and said electron ejecting layer;

wherein said multiple quantum well infrared absorbing layer comprises a plurality of alternating layers of GaAs and $Al_xGa_{1-x}As$, wherein each of said GaAs layers has a thickness in the range of about 35 to about 50 Angstroms and is doped n-type, wherein each of said $Al_xGa_{1-x}As$ layers has a thickness in the range of about 300 to about 500 Angstroms and is undoped $Al_xGa_{1-x}As$, and wherein x is in the range of about 0.26 to about 0.29.

41. An enhanced quantum well photocathode comprising:

a first contact layer having first and second opposing sides;

a plurality of elongate multiple quantum well infrared radiation absorbing elements having opposed first and second longitudinal surfaces disposed on said first contact layer, said first longitudinal surface of each of said elongate multiple quantum well infrared radiation absorbing elements being in contact with said first surface of said first contact layer, said plurality of elongate multiple quantum well elements comprising a diffraction grating for incident infrared radiation;

said second longitudinal surface of each of said elongate multiple quantum well infrared radiation absorbing elements having a second contact layer disposed thereon;

an electrode for receiving an absorption bias voltage applied between said electrode and said second contact layer disposed on said second longitudinal surface of each of said elongate multiple quantum well infrared radiation absorbing elements; and a negative electron affinity surface disposed on at least a portion of said second side of said first contact layer, said electrode being disposed on at least a portion of one of said second side of said first contact layer and said negative electron affinity surface;

wherein each of said elongate multiple quantum well infrared radiation absorbing elements comprises a plurality of alternating layers of GaAs and $Al_xGa_{1-x}As$, wherein each of said GaAs layers has a thickness in the range of about 35 to about 50 Angstroms and is doped n-type, wherein each of said $Al_xGa_{1-x}As$ layers has a thickness in the range of about 300 to about 500 Angstroms and is undoped $Al_xGa_{1-x}As$, and wherein x is in the range of about 0.26 to about 0.29.

* * * * *